United States Patent
Lay

(10) Patent No.: US 9,534,739 B2
(45) Date of Patent: Jan. 3, 2017

(54) MULTIPLE-PLY SOLID STATE LIGHT FIXTURE

(71) Applicant: Cree, Inc., Durham, NC (US)

(72) Inventor: James Michael Lay, Apex, NC (US)

(73) Assignee: Cree, Inc., Durham, NC (US)

( * ) Notice: Subject to any disclaimer, the term of this patent is extended or adjusted under 35 U.S.C. 154(b) by 34 days.

(21) Appl. No.: 14/080,986

(22) Filed: Nov. 15, 2013

(65) Prior Publication Data

US 2015/0138776 A1    May 21, 2015

(51) Int. Cl.
  *F21S 8/04*        (2006.01)
  *F21K 99/00*       (2016.01)
      (Continued)

(52) U.S. Cl.
  CPC . *F21K 9/10* (2013.01); *F21K 9/90* (2013.01); *F21S 8/026* (2013.01); *F21S 8/043* (2013.01);
      (Continued)

(58) Field of Classification Search
  CPC ........ F21V 23/005; F21V 29/70; F21V 29/87; F21V 25/12; F21V 31/04; F21K 9/00; F21K 9/90; F21Y 2105/00; F21Y 2105/10; F21Y 2105/16; F21Y 2115/10; H05K 1/0201; H05K 1/0203; H05K 1/0209; F21S 8/026; F21S 8/04; F21S 8/043; F21S 8/046; Y10T 29/491146
  See application file for complete search history.

(56) References Cited

U.S. PATENT DOCUMENTS

| 6,239,378 B1 * | 5/2001 | Shephard ................. C08K 3/34 174/110 S |
| 7,213,940 B1 | 5/2007 | Van De Ven et al. |

(Continued)

FOREIGN PATENT DOCUMENTS

| DE | 202012009187 U1 | 11/2012 |
| EP | 2365525 A2 | 9/2011 |
| EP | 2644964 A1 | 10/2013 |

OTHER PUBLICATIONS

IBM, Corp.; "Thermally Conductive Elastomer for Cooling," IBM Technical Disclosure Bulletin, 1985, p. 1490, vol. 28.

(Continued)

*Primary Examiner* — Anh Mai
*Assistant Examiner* — Steven Horikoshi
(74) *Attorney, Agent, or Firm* — Steven B. Phillips; Moore & Van Allen PLLC

(57) ABSTRACT

A multiple-ply solid state light fixture is disclosed. A panelized, solid state light fixture includes combined layers of material chemically bonded together without a traditional mechanical housing and with relatively few or no fasteners. In example embodiments, the solid state light fixture includes an LED mounting substrate, a thermal material on a non-LED side of the LED mounting substrate, and an optical material on the LED side of the LED mounting substrate. A plurality of LEDs are disposed or mounted, with or without additional packaging, on the LED side of the LED mounting substrate. A chemical bond is created between the substrate and the other layers. This chemical bond can be created, for example, through use of applied fluid or gelatinous compounds that are then solidified, or through the use of adhesives.

14 Claims, 9 Drawing Sheets

(51) Int. Cl.
  *H05K 1/02*   (2006.01)
  *F21V 25/12*  (2006.01)
  *F21V 31/04*  (2006.01)
  *F21S 8/02*   (2006.01)
  *F21V 23/00*  (2015.01)

(52) U.S. Cl.
  CPC ............ *F21V 23/005* (2013.01); *F21V 25/12* (2013.01); *F21V 31/04* (2013.01); *H05K 1/0201* (2013.01); *H05K 1/0209* (2013.01); *F21Y 2105/10* (2016.08); *F21Y 2115/10* (2016.08); *H05K 2201/10106* (2013.01); *Y10T 29/49146* (2015.01)

(56)       References Cited

U.S. PATENT DOCUMENTS

| | | | | |
|---|---|---|---|---|
| 2002/0141181 | A1* | 10/2002 | Bailey | E04B 9/32 362/150 |
| 2004/0113549 | A1* | 6/2004  | Roberts et al. | 313/512 |
| 2005/0116667 | A1* | 6/2005  | Mueller et al. | 315/312 |
| 2005/0276053 | A1* | 12/2005 | Nortrup et al. | 362/294 |
| 2006/0198128 | A1  | 9/2006  | Peipgras et al. | |
| 2007/0103902 | A1* | 5/2007  | Hsiao | E04F 13/0871 362/240 |
| 2007/0103939 | A1* | 5/2007  | Huang et al. | 362/633 |
| 2008/0265781 | A1* | 10/2008 | Lin et al. | 315/113 |
| 2010/0149798 | A1* | 6/2010  | Scott | 362/235 |
| 2010/0188845 | A1* | 7/2010  | Rooms et al. | 362/191 |
| 2011/0170294 | A1* | 7/2011  | Mier-Langner et al. | 362/294 |
| 2011/0175533 | A1* | 7/2011  | Holman et al. | 315/130 |
| 2011/0204780 | A1  | 8/2011  | Shum et al. | |
| 2011/0316014 | A1* | 12/2011 | Hiroyuki | 257/89 |
| 2012/0201007 | A1  | 8/2012  | Yeh et al. | |
| 2012/0306366 | A1* | 12/2012 | Sakai et al. | 315/51 |
| 2014/0293650 | A1* | 10/2014 | Knight | F21V 23/06 362/612 |

OTHER PUBLICATIONS

International Search Report & Written Opinion for International Application No. PCT/US2014/065172 dated Feb. 23, 2015.

* cited by examiner

MULTIPLE-PLY SOLID STATE LIGHT FIXTURE

BACKGROUND

Light emitting diode (LED) lighting systems are becoming more prevalent as replacements for existing lighting systems. LEDs are an example of solid state lighting and have advantages over traditional lighting solutions such as incandescent and fluorescent lighting because they use less energy, are more durable, operate longer, can be combined in multi-color arrays that can be controlled to deliver virtually any color light, and contain no lead or mercury.

In many applications, one or more LED dies (or chips) are mounted within an LED package or on an LED module, which may make up part of a lighting system, a light fixture, lighting unit, lamp, "light bulb" or more simply a "bulb," which includes one or more power supplies to power the LEDs. An LED fixture may be made in the form of a fixture to be used in place of or instead of a standard incandescent or fluorescent fixture.

Rigid or semi-rigid materials may be included in a fixture as optical elements, reflectors, support structures and housings external to the LED modules themselves. Typically, a combination of mechanical components is used to complete a fixture assembly. This combination may include a mechanical housing for the electronics, a mechanical housing for the entire fixture, a heatsink, a mounting surface for the LED modules, and lenses or diffusers to provide shape, direction, and/or color mixing for the light emitted from the fixture.

SUMMARY

Embodiments of the invention can provide a unitary light fixture by combining layers of material and/or components, wherein the layers are chemically bonded together without a traditional mechanical housing and with relatively few or no fasteners. A panelized, solid state light fixture according to at least some embodiments of the invention includes an LED mounting substrate, a thermal material on the non-LED side of the LED mounting substrate, and an optical material on the LED side of the LED mounting substrate. A plurality of LEDs are disposed or mounted, with our without additional packaging, on the LED side of the LED mounting substrate.

The LED mounting substrate can be chemically bonded to the thermal material, the optical material, or both. The chemical bonding can be achieved in various ways, for example, by using materials that solidify or can be solidified in place, or by using adhesive. For example, the thermal material can be or include a potting compound. The potting compound can be applied in a fluid or gelatinous state and allowed or caused to solidify. In some embodiments, the optical material can be or include an optical compound such as silicone and/or acrylic. If an adhesive is used to chemically bond the layers or plies together, the adhesive is disposed between the substrate and the thermal material and/or the optical material.

In some embodiments, the light fixture includes a supporting frame proximate to at least one side of the LED mounting substrate. If the supporting frame is proximate to the non-LED mounting side of the mounting substrate, it can be surrounded by the potting compound that is used as the thermal material for the fixture. A supporting frame could also be placed on the "optical" side of the panelized fixture and be surrounded by the optical compound.

In at least some embodiments, the fixture includes power supply circuitry connected to the plurality of LEDs in the fixture. The power supply circuitry may also be referred to as the "power supply" or "driver" for the LEDs in the fixture. The power supply components may be kept close together in one area of the panelized fixture or may be distributed on either or both sides of the LED mounting substrate. The panelized, solid state light fixture may also include a control input for at least some of the plurality of LEDs. In some embodiments, the control input may include a local area network (LAN) connector, for example, an RJ-45 connector for Ethernet connectivity.

In at least some embodiments, a panelized solid state light fixture is assembled by mounting a plurality of LEDs on a substrate and connecting power supply circuitry to the plurality of LEDs. A thermal material is applied to a non-LED side of the substrate so that the thermal material is chemically bonded to the substrate and an optical material is applied to an LED side of the substrate so that the optical material is chemically bonded to the substrate. In some embodiments, the thermal material and/or the optical material is applied as a fluid or gelatinous compound and allowed or caused to solidify. A supporting frame can be assembled on the substrate prior to applying the compound. Alternatively the substrate and one or both material layers can be chemically bonded using adhesive, as previously discussed.

BRIEF DESCRIPTION OF THE DRAWINGS

FIG. 4 is rendered as see-though so that details of the fixture's construction may be observed.

DETAILED DESCRIPTION

Figure 1:
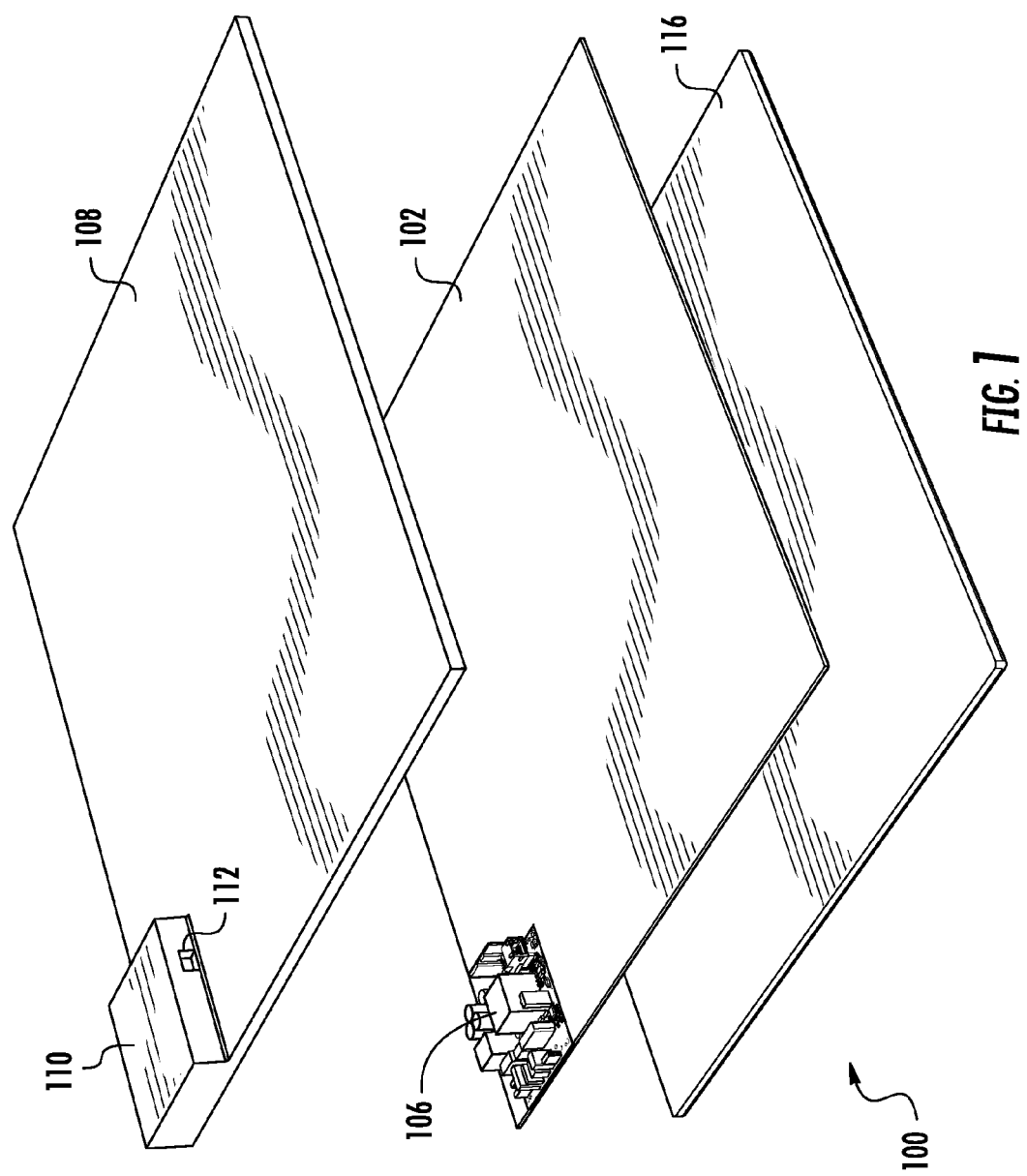
FIG. 1 is an exploded, perspective view of a light fixture according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid state emitter depends on the materials of the active layers thereof. In various embodiments, solid state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near-white in character. In certain embodiments, the aggregated output of multiple solid state light emitters and/or lumiphoric materials may generate warm white light output having a color temperature range of from about 2700K to about 4000K.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

At various places in this disclosure, reference is made to a "thermal" material, "thermal" layer, and the like. Such references refer to material that can be coated, applied, or otherwise chemically bonded to the plenum side of a panelized light fixture according to example embodiments of the invention, and allow the fixture to maintain a "plenum rating." Such a material may also be thermally reflective. Some buildings utilize ducted HVAC systems, where air return vents replace standard ceiling tiles, and ductwork carries the return air back to the heating and cooling systems. These are referred to as non-plenum ceilings. Increasingly however, new building construction utilizes plenum returns, where the entire air space above the ceiling is negatively pressured and draws return air either through light fixtures specially designed to allow air passage (called air return fixtures) or through slots in the ceiling grid system specifically placed to provide a return air path to the heating and cooling systems. From a lighting provider's perspective, these are "plenum-ceiling applications" or more simply "plenum applications."

Materials utilized for mechanical components in a plenum application should pass stringent regulatory requirements called out in the United States in National Fire Protection Association (NFPA) standard 90a ("Standard for Air-Conditioning and Ventilating Systems"). The test method for verification of these requirements is specified in NFPA 262, "Standard Method of Test for Flame Travel and Smoke of Wire and Cables." Under these standards, an arduous test is performed to verify compliance with a smoke propagation requirement. While many compounds are flame retardant and self-extinguishing, they still emit a large amount of smoke when an external flame source is used to burn them. In a plenum application, if a fire were to encounter a very smoke-prone plastic in the ceiling, smoke would be immediately be sucked into the HVAC system and circulated throughout the building, endangering the health and safety of people in the building as they attempting to exit. Embodiments of the invention use a material for the top ply of the panelized fixture that once solidified or otherwise caused to adhere to the substrate, enable the fixture to maintain a plenum rating.

Some thermal and optical materials are referred to herein as being "solidified" or reference is made to causing the material to "solidify." By this term, what is generally meant is that the material or compound is applied to a substrate as a liquid or gel (a "fluid or gelatinous" material) and becomes solid in place. Depending on the material, this solidification can occur by simply allowing the material or compound to cure or solidification can be caused by temperature changes, or any other technique including exposing the material to ultraviolet light. Potting compounds as well as various acrylics and silicones can be used in this way, the latter being examples of optical compounds since they are generally clear and can transmit light. It should be noted that some clear compounds could also be used as a potting compound on the top of a panelized fixture; a potting compound and an optical compound could be the same. In such a case, these terms distinguish the function of the materials within a fixture according to example embodiments of the invention.

A fixture according to example embodiments of the invention may be referred to herein as a "panelized" fixture. By the term "panelized" what is meant is that the fixture presents an impression of a relatively flat, solid object, with the possible exception of cables and/or an enclosed area for power supply or driver circuitry. Such a fixture, in illustrated embodiments would be square and of an appropriate size for use in a tiled ceiling in the space of a single tile. However, the fixture according to embodiments of the invention could be made any shape or size, and could be used in many applications, including as built-in furniture lighting, automotive lighting, and residential architectural lighting. The electronics for the power supply or driver can also be small enough to fit within the layered panel structure so that a separate enclosed area would not protrude from the fixture.

What allows the fixture of example embodiments of the invention to be "panelized" is its use of layers or plies of material that are chemically bonded together as opposed to being assembled mechanically through use of snap-fitting components, screws, tabs, threads, and the like. This chemical bonding can be achieved in any of various ways. For example the use of materials solidified in place causes the materials to adhere to each other at the interface. A separate adhesive compound or substance can also be used. An adhesion promoter can also be used either for solidified materials or materials joined by adhesive, as can a solvent. For purposes of this disclosure, examples of a chemical bond include a covalent bond, an ionic bond, and a bond caused by van der Waals force. An ultrasonic weld also causes a chemical bond for purposes of this disclosure, since ultrasonic welding disrupts molecules at the surfaces involved and causes a chemical bond.

Figure 2:
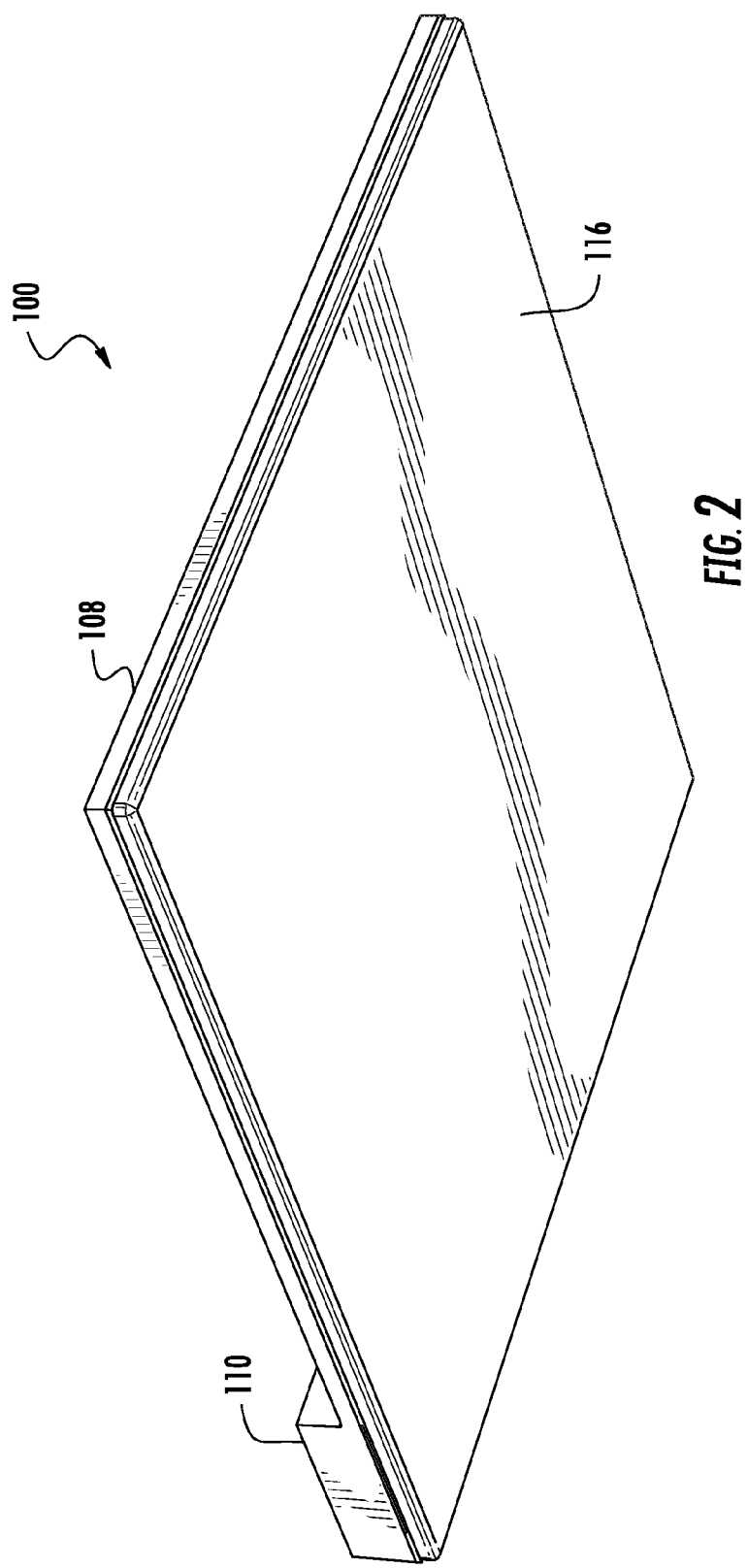
FIG. 2 is a bottom perspective view of the light fixture of FIG. 1.
Figure 3:
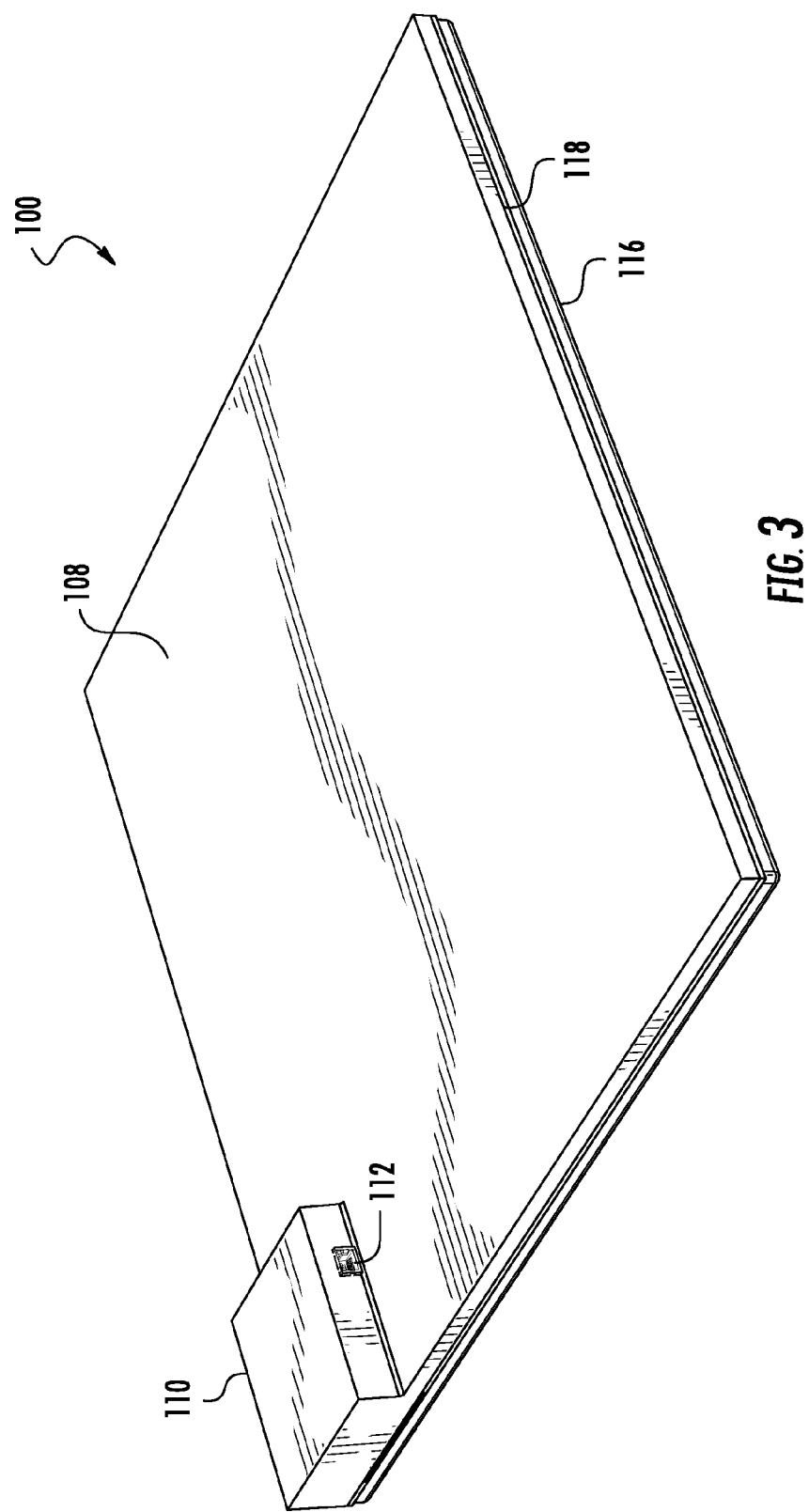
FIG. 3 is a top perspective view of the light fixture of FIG. 1.
Figure 4:
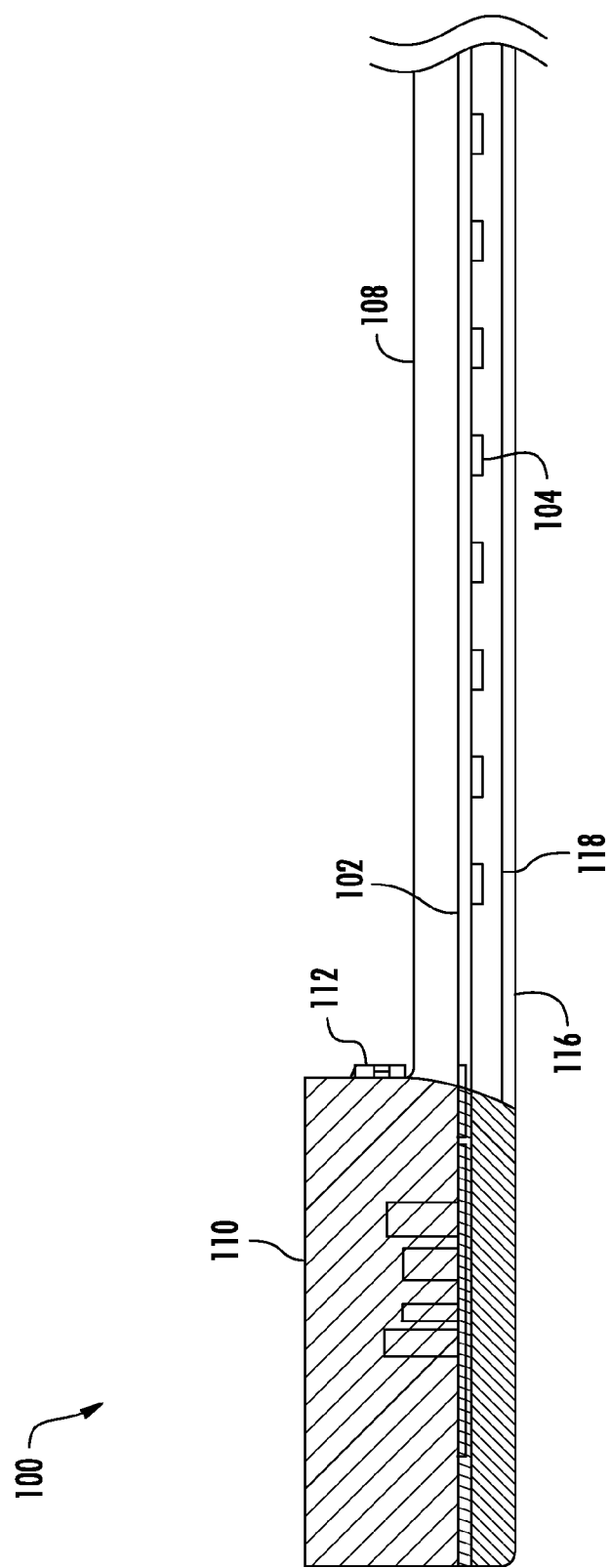
FIG. 4 is a partial side view of the light fixture of FIGS. 1, 2 and 3.

FIGS. 1, 2, 3, and 4 illustrate a panelized, solid state light fixture according to example embodiments of the invention. FIG. 1 is an exploded, perspective view. FIG. 2 is a bottom perspective view. FIG. 3 is a top perspective view. FIG. 4 is a see through, side view of the fixture. Fixture 100 includes 3 layers or "plies." LED mounting substrate 102 includes LEDs 104 on the lower or bottom side and electrical connections and/or driver components on the upper or top side. The LED mounting substrate can be manufactured from a multi-layer circuit board, an aluminum metal core board, flexible circuit material, or similar substrate materials. Power supply circuitry, including typical power supply components, can be mounted on the back or upper side of the board either in a specific area, such as power supply circuitry 106, or can be distributed across the board (not shown). The panelized fixture of embodiments of the invention can use either an AC or DC power supply, depending on the application. The electronics used to drive the LEDs include rectifiers, regulators, timing circuitry, and other components. In addition to converting AC line current to DC, conversion can be made between different DC voltages in order to appropriately power the LED devices used in the fixture.

Still referring to FIGS. 1, 2, 3, and 4, fixture 100 also includes thermal material 108 on the non-LED (upper) side of the mounting substrate 102. Thermal material 108 may be molded or otherwise manufactured in advance, and fastened to substrate 102 with adhesive. Alternatively, thermal material 108 may be solidified in place, applied first as a fluid or gelatinous material, and cured or allowed to solidify over time. In the latter case, a potting compound can be used. If this ply is applied with adhesive after it is solid, voids may need to be included for distributed power supply and/or control circuitry. Otherwise, if a potting compound is solidified in place, it will naturally conform to the topology of the wired LED substrate. Many suitable potting compounds can be used. Examples of suitable potting compounds include Dow Sylguard 160 and Lord SC-303, SC309, or CK6703 as examples.

A small housing, 110 in FIGS. 1, 2, 3, and 4, can be included in the thermal material ply when the layer is manufactured prior to assembly. Alternatively, a frame can be used to raise a potting compound or similar materials to the appropriate height if solidified thermal material is used to make the panelized fixture. An appropriate connector, 112, is included for an external power to be supplied to the fixture. In cases where control connections are included in the fixture, and additional connector or cable can also be included.

Still referring to FIGS. 1, 2, 3, and 4, optical material 116 covers LEDs 104 and provides color mixing, diffusion, focusing or the like depending on the optical design of the panelized fixture. Optical material 116 again may be molded or otherwise manufactured in advance, and fastened to substrate 102 with adhesive. Alternatively, optical material 116 may be solidified in place, applied first as a fluid or gelatinous material, and cured or allowed to solidify over time. Acrylic, silicone, or another clear material can be used. If this ply is applied with adhesive after it is solid, voids may need to be included for LEDs 104. Such an optical ply can also be shaped to enhance or control its optical characteristics as well, for example, to provide color mixing or a specific beam pattern. If an optical compound is solidified in place, the compound will naturally conform to the topology of the LEDs on the substrate. The LEDs may be bare chips or they may be packaged as modules, possibly with multiple chips to a module. Such arrangements can be used to generate substantially white light using multiple color-emitting LEDs and possibly a phosphor. Optical material 116 in example embodiments is shaped with an angled edge set apart by line 118 to provide a pleasing aesthetic. If the optical ply is solidified in place a suitable frame can be used to create this feature.

Embodiments of the invention as described above provide a unitary light fixture by combining layers of material and/or components, wherein the layers are chemically bonded together without a traditional mechanical housing. The chemical bonding can be achieved in various ways, for example, by using materials that solidify or can be solidified in place, or by using adhesive. In some embodiments, the optical material can be or include an optical compound such as silicone and/or acrylic. If an adhesive is used to chemically bond the layers or plies together, the adhesive is disposed between the substrate and the thermal material and/or the optical material. Otherwise, the layers or plies of solidified material adhere to the mounting substrate because the thermal and optical compounds are solidified in place, creating a chemical bond at the boundary between layers.

Figure 5:
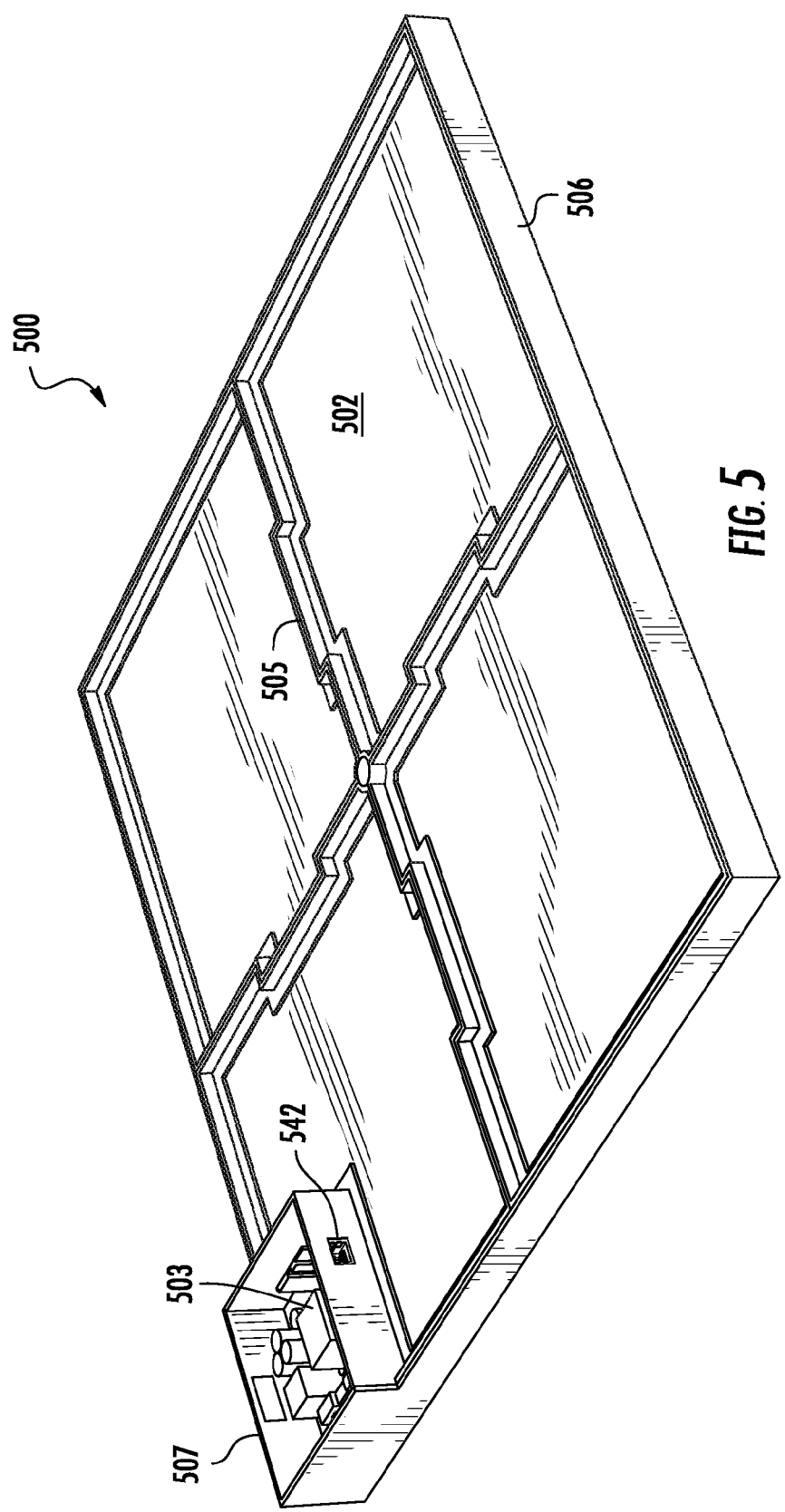
FIG. 5 is a top perspective view of a partially assembled light fixture according to additional embodiments of the present invention.
Figure 6:
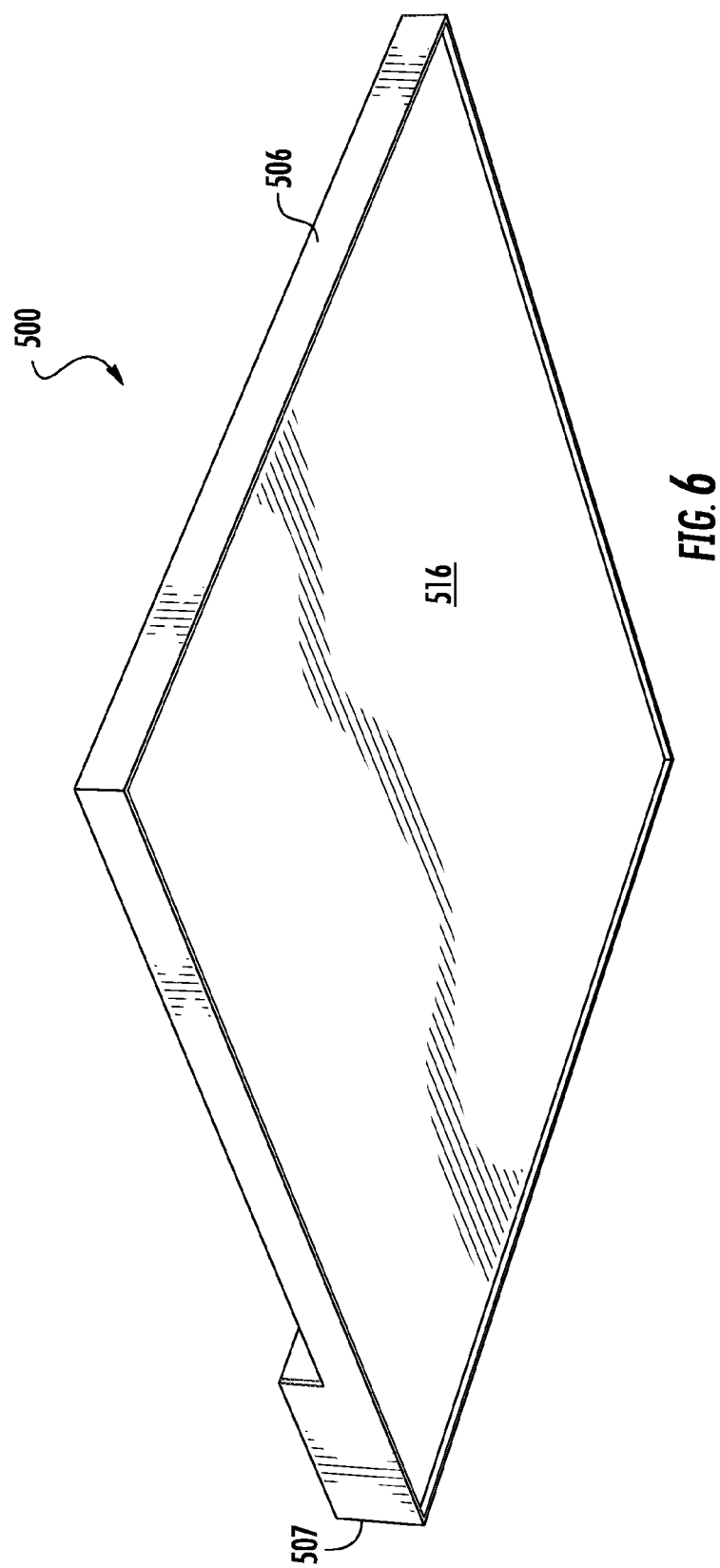
FIG. 6 is a bottom perspective view of the light fixture of FIG. 5.
Figure 7:
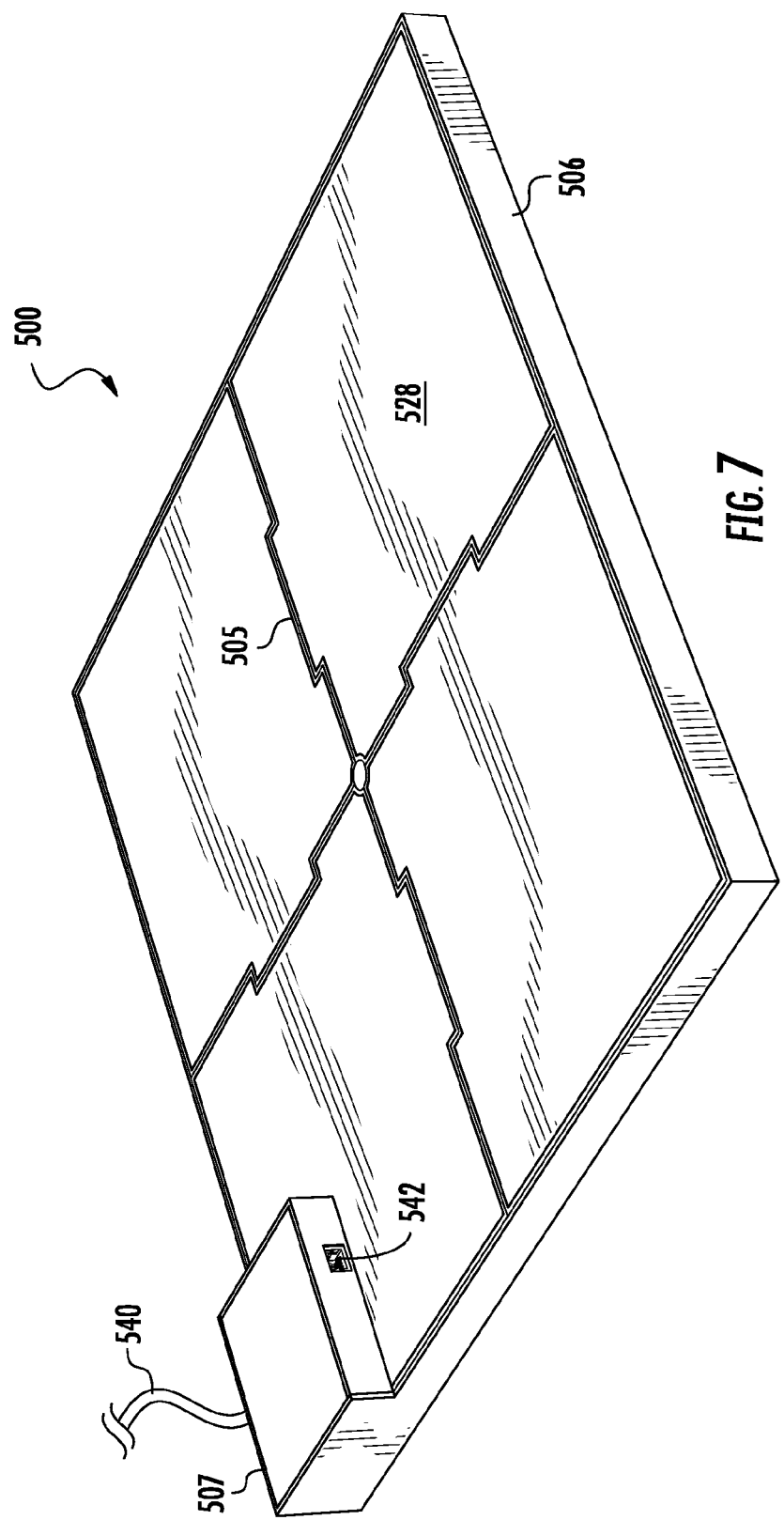
FIG. 7 is a top perspective view of the light fixture of FIGS. 5 and 6 after the fixture has been fully assembled.

FIGS. 5, 6, and 7 illustrate a panelized, solid-state light fixture according to additional embodiments of the present invention. FIG. 5 is a top perspective view of the light fixture prior to application of the thermal material. FIG. 6 is a bottom perspective view of the light fixture as it would appear after application of the optical material, either before or after the thermal material is applied. FIG. 7 is a top perspective view of the completed fixture with the thermal material applied as a potting compound that has solidified in place. LED mounting substrate 503 includes LEDs (not visible) on the lower side and electrical connections and/or driver components on the upper side. The LED mounting substrate can be manufactured from a multi-layer circuit board, an aluminum metal core board, flexible circuit material, or similar substrate materials. Power supply circuitry can be mounted on the back of the board either in a specific area, such as power supply circuitry 503, including typical electrical components, or can be distributed across the board (not shown).

As previously discussed, the panelized fixture of embodiments of the invention can use either an AC or DC power supply, depending on the application, however in the particular example of FIGS. 5, 6, and 7 the fixture is designed to operate from AC line voltage. The electronics used to drive the LEDs include rectifiers, regulators, timing circuitry, and other components. Also in this particular example, a supporting frame 505 is installed proximate to the non-LED side of the mounting substrate 502 to provide the fixture with additional strength. Optionally, another supporting frame 506 surrounds the edges of the panelized fixture, and includes an enclosure 507 for power supply circuitry and components 503.

Still referring to FIGS. 5, 6, and 7, optical material 516 covers the LEDs and provides color mixing, diffusion, focusing or the like depending on the optical design of the panelized fixture. Optical material 516 again may be molded or otherwise manufactured in advance, in this case to fit within frame 505 and fastened to substrate 502 and optionally the frame with adhesive. Alternatively, optical material 516 may be solidified in place, applied first as a fluid or gelatinous material within frame 505, and cured or allowed to solidify over time. Acrylic, silicone, or another clear material can be used. If this ply is applied with adhesive after it is solid, voids may need to be included for the LEDs. Otherwise, if an optical compound is solidified in place, the compound will naturally conform to the topology of the LEDs on the substrate. The LEDs may be bare chips or they may be packaged as modules.

FIG. 7 illustrates fixture 500 in its finished state, including thermal material 528 on the non-LED side of the mounting substrate. Thermal material 528 may be molded or otherwise manufactured in advance, and fastened to the mounting substrate and frame(s) with adhesive. In such a case it can be made of multiple parts to fit within the frame, or made as one piece with voids for the frame members. In this example, thermal material 528 is solidified in place, applied first as a fluid or gelatinous material, and cured or allowed to solidify over time. As before, a potting compound can be used. In this example, the compound also fills frame 507 around the power supply circuitry.

Also visible in FIG. 7 is an AC connecting cable 540. Visible in FIG. 7 as well as in FIG. 5 is also a control input 542 for at least some of the plurality of LEDs. This control input can be used to adjust color or brightness, or can be used to provide timing functions. In some embodiments, the control input may include a local area network (LAN) connector. In this example the physical connection for input 542 is provided by an RJ-45 connector for Ethernet connectivity.

Figure 8:
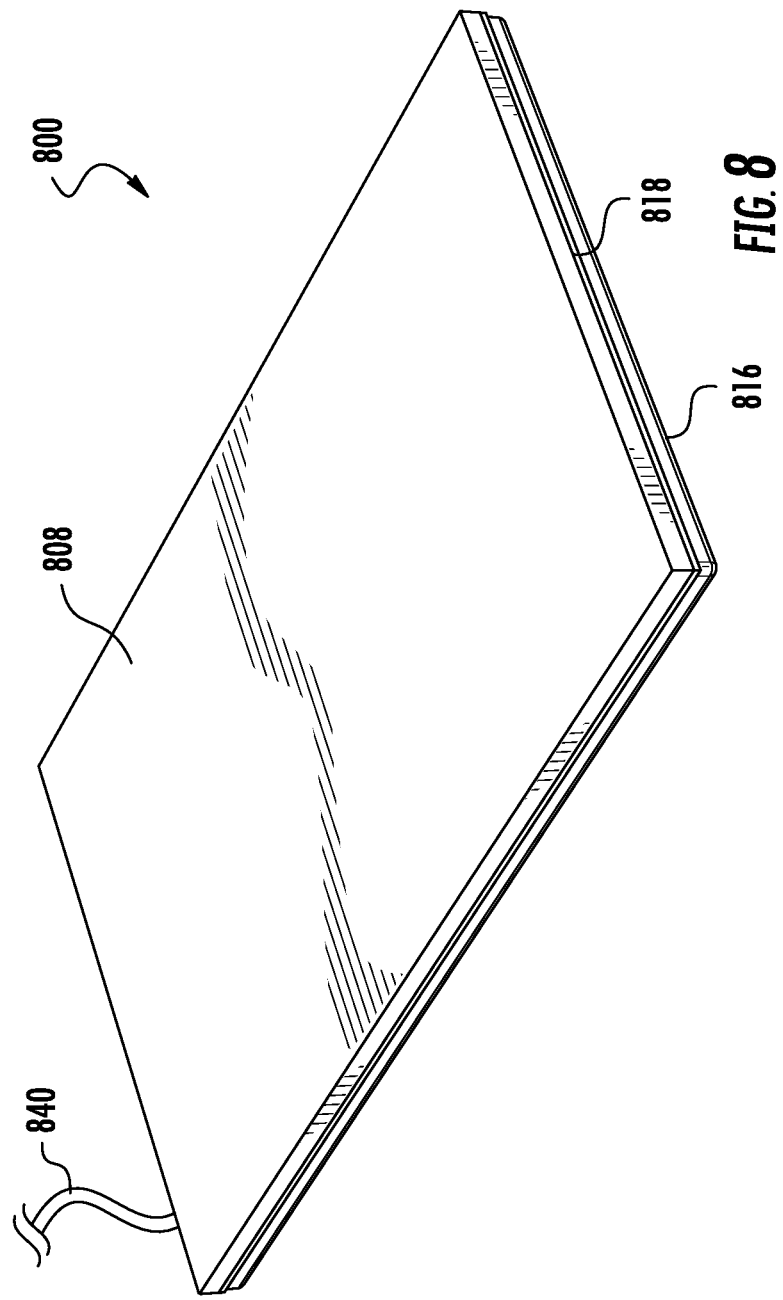
FIG. 8 is a perspective view of a light fixture according to additional embodiments of the present invention.

As previously mentioned, a light fixture according to example embodiments of the invention can come in various shapes and may use electrical components, such as those for a power supply, that are small enough to fit within the layers panel structure of the fixture. FIG. 8 illustrates a rectangular fixture, 800. Fixture 800 includes thermal material 808 on the non-LED (upper) side of the mounting substrate. Optical material 816 again may be molded or otherwise manufactured in advance, and fastened to the substrate with adhesive. Optical material 816 in example embodiments is shaped with an angled edge set apart by line 818 as before to provide a pleasing aesthetic for the rectangular fixture. Again, if the optical ply is solidified in place a suitable frame can be used to create this feature. In the example of FIG. 8, the driver electronics fit within the layered panel. A connector (not visible) is partly submerged in the thermal layer, and connecting cable 840 can supply power and/or control signal to the fixture.

Figure 9:
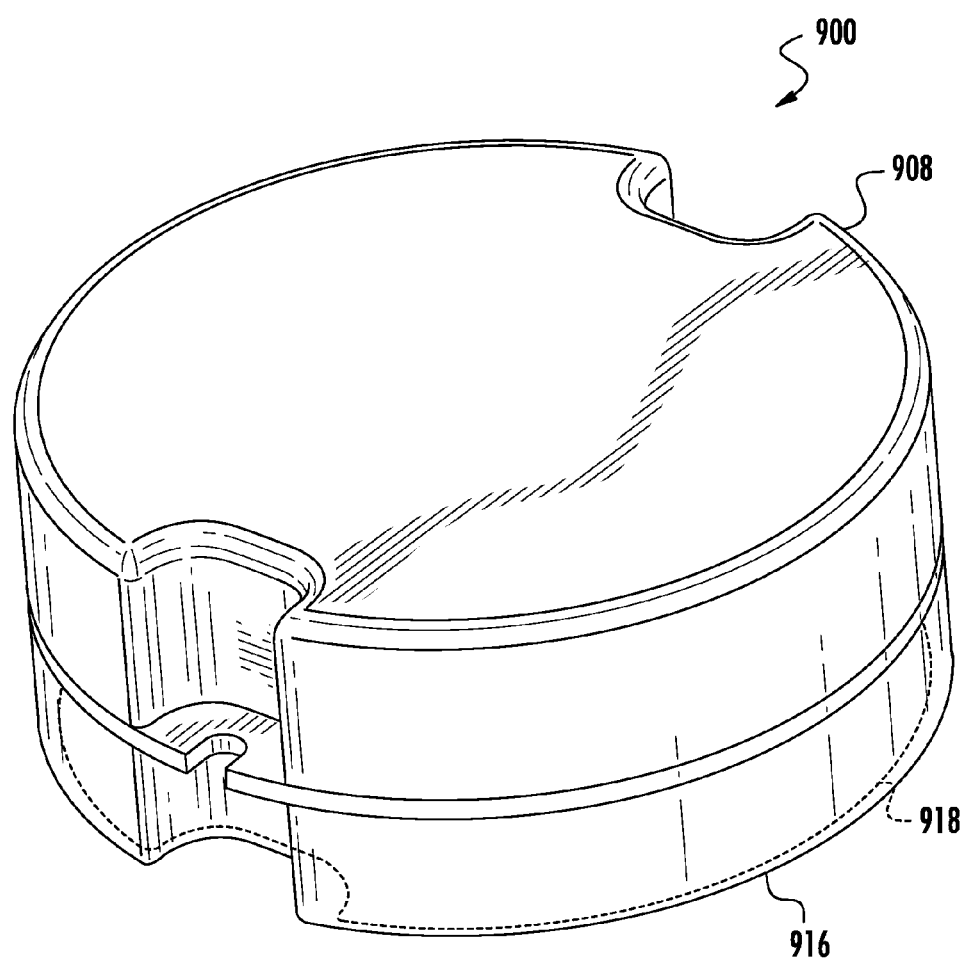
FIG. 9 is a perspective view of a light fixture according to further additional embodiments of the present invention.

FIG. 9 illustrates a small, round fixture, 900. Fixture 900 includes thermal material 908 on the non-LED (upper) side of the mounting substrate. Optical material 916 again may be molded or otherwise manufactured in advance, and fastened to the substrate with adhesive. Line 918 provides a pleasing aesthetic for fixture 900. In the example of FIG. 9, the driver electronics again fit within the layered panel. A connector (not visible) can be partly submerged in the thermal layer, and a connecting cable can supply power and/or control signal to the fixture.

LEDs used with an embodiment of the invention and can include light emitting diode chips that emit hues of light that, when mixed, are perceived in combination as white light. Phosphors can also be used. LEDs can be packaged as modules with includes phosphor in the module or applied to LED dies, or appropriate phosphor can be deployed within the fixture, for example, by including phosphor particles in the optical material. For example, blue-shifted yellow (BSY) LED devices can be used with a red phosphor to create substantially white light, or combined with red emitting LED devices on the heatsink to create substantially white light. By use of the term substantially white light, one could be referring to a chromaticity diagram including a blackbody locus of points, where the point for the source falls within four, six or ten MacAdam ellipses of any point in the blackbody locus of points.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices are deployed in groups. One group includes LEDs, wherein each LED, if and when illuminated, emits light having dominant wavelength from 440 to 480 nm. The LEDs can then include another group of LEDs, wherein each LED, if and when illuminated, emits light having a dominant wavelength from 605 to 630 nm. Each of the former, blue LEDs are packaged with a phosphor that, when excited, emits light having a dominant wavelength from 560 to 580 nm, so as to form a blue-shifted-yellow LED device. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Embodiments of the invention can use varied fastening methods and mechanisms for interconnecting the parts of the light fixture that are not chemically bonded as part of the plies. For example, in some embodiments locking tabs and holes can be used to enclose the power supply or attach electrical components to the mounting substrate. In some embodiments, combinations of fasteners such as tabs, latches or other suitable fastening arrangements and combinations of fasteners can be used which would not require adhesives or screws. In other embodiments, screws, bolts, or other fasteners may be used to fasten together the various components.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A panelized, solid state light fixture comprising:
   an LED mounting substrate;
   a solidified thermal material bonded to a non-LED side of the LED mounting substrate to impart a plenum application rating to the solid state light fixture;
   a plurality of LEDs on an LED side of the LED mounting substrate;
   an optical material on the LED side of the LED mounting substrate; and
   a supporting frame and enclosure for at least some power supply circuitry on the non-LED side of the LED mounting substrate, wherein the supporting fame and enclosure form a unitary structure, the supporting frame containing the solidified thermal material;
   wherein the solidified thermal material, the optical material, and the substrate form the solid state light fixture as a multiple-ply, relatively flat solid object.

2. The panelized, solid state light fixture of claim 1 wherein the LED mounting substrate is chemically bonded to at least one of the solidified thermal material and the optical material.

3. The panelized, solid state light fixture of claim 2 wherein the solidified thermal material comprises a potting compound.

4. The panelized, solid state light fixture of claim 3 wherein the optical material comprises at least one of silicone and acrylic.

5. The panelized, solid state light fixture of claim 2 wherein at least some of the power supply circuitry is distributed on at least one of the non-LED side and the LED side of the LED mounting substrate.

6. The panelized, solid state light fixture of claim 2 further comprising a control input for at least some of the plurality of LEDs.

7. The panelized, solid state light fixture of claim 6 wherein the control input comprises a local area network (LAN) connector.

8. A method of assembling a panelized, solid state light fixture, the method comprising:
   mounting a plurality of LEDs on a substrate;
   installing a supporting frame and enclosure on the substrate, wherein the supporting frame and enclosure form a unitary structure;
   installing power supply circuitry in an enclosure and connecting the power supply circuitry to the plurality of LEDs;
   imparting a plenum application rating to the panelized, solid date light fixture by applying thermal material to a non-LED side of the substrate so that the thermal material is contained by the supporting frame and solidifies and becomes chemically bonded to the substrate; and
   applying an optical material to an LED side of the substrate so that the optical material is chemically bonded to the substrate, and the thermal material, the optical material, and the substrate form the solid state light fixture as a multiple-ply, relatively flat solid object that is of appropriate size for use in a tiled ceiling.

9. The method of claim 8 wherein the applying of the thermal material comprises applying a fluid or gelatinous potting compound and allowing or causing the potting compound to solidify.

10. The method of claim 9 wherein the applying of the optical material further comprises applying a fluid or gelatinous optical compound and allowing or causing the optical compound to solidify.

11. A panelized, solid state light fixture comprising:
    an LED mounting substrate;
    a supporting frame and enclosure on the LED mounting substrate, wherein the supporting frame and enclosure form a unitary structure;
    a solidified thermal material contained in the supporting frame and chemically bonded to a non-LED side of the LED mounting substrate to impart a plenum application rating to the solid state light fixture;
    a plurality of LEDs on an LED side of the LED mounting substrate;
    power supply circuitry connected to the plurality of LEDs; and
    an optical material chemically bonded to the LED side of the LED mounting substrate;
    wherein the the thermal material, the optical material, and the LED mounting substrate form the panelized, solid state light fixture as a multiple-ply, relatively flat solid object.

12. The light fixture of claim 11 wherein the thermal material comprises a solidified potting compound.

13. The light fixture of claim 12 further comprising a second supporting frame on the LED side of the LED mounting substrate.

14. The light fixture of claim 12 wherein the optical material further comprises a solidified optical compound.

* * * * *